(12) United States Patent
Vander Mey et al.

(10) Patent No.: US 9,231,142 B2
(45) Date of Patent: Jan. 5, 2016

(54) NON-PARABOLIC SOLAR CONCENTRATION TO AN AREA OF CONTROLLED FLUX DENSITY CONVERSION SYSTEM AND METHOD

(75) Inventors: James E. Vander Mey, Dunnellon, FL (US); Douglas Helff Kiesewetter, Jr., Montrose, CO (US); Shane Mark Duckworth, Montrose, CO (US)

(73) Assignee: BRIGHTLEAF TECHNOLOGIES INC., Montrose, CO (US)

( * ) Notice: Subject to any disclaimer, the term of this patent is extended or adjusted under 35 U.S.C. 154(b) by 1394 days.

(21) Appl. No.: 12/899,337

(22) Filed: Oct. 6, 2010

(65) Prior Publication Data
US 2011/0079269 A1    Apr. 7, 2011

Related U.S. Application Data

(60) Provisional application No. 61/249,202, filed on Oct. 6, 2009.

(51) Int. Cl.
| | |
|---|---|
| *H01L 31/052* | (2014.01) |
| *F24J 2/10* | (2006.01) |
| *F24J 2/52* | (2006.01) |
| *H01L 31/054* | (2014.01) |

(52) U.S. Cl.
CPC ............... *H01L 31/0525* (2013.01); *F24J 2/10* (2013.01); *F24J 2/523* (2013.01); *H01L 31/0547* (2014.12); *F24J 2002/108* (2013.01); *F24J 2002/1014* (2013.01); *Y02E 10/47* (2013.01); *Y02E 10/52* (2013.01)

(58) Field of Classification Search
CPC .................. H01L 31/0547; H01L 31/0525
See application file for complete search history.

(56) References Cited

U.S. PATENT DOCUMENTS

| | | | |
|---|---|---|---|
| 4,062,038 A * | 12/1977 | Cuomo et al. | ............... 136/258 |
| 4,665,895 A | 5/1987 | Meier | |
| 4,943,325 A | 7/1990 | Levy | |
| 7,473,000 B2 | 1/2009 | Spencer et al. | |
| 7,545,011 B2 | 6/2009 | Horne et al. | |
| 2006/0225730 A1 | 10/2006 | Anderson | |
| 2007/0256724 A1 | 11/2007 | Fork et al. | |
| 2007/0256725 A1 | 11/2007 | Fork et al. | |
| 2007/0256726 A1 | 11/2007 | Fork et al. | |

(Continued)

FOREIGN PATENT DOCUMENTS

| | | | | |
|---|---|---|---|---|
| EP | 2012366 A2 | 1/2009 | | |
| JP | 11-245897 A | * | 9/1999 | ............... B64G 1/44 |

(Continued)

OTHER PUBLICATIONS

PCT International Preliminary Report on Patentability for PCT/US2010/051683, Apr. 19, 2012.

(Continued)

*Primary Examiner* — Golam Mowla
(74) *Attorney, Agent, or Firm* — Bracewell & Giuliani LLP

(57) ABSTRACT

A solar conversion system with a solar collector that is shaped to focus reflected sunlight along an area with a substantially constant flux density. The area shape can be resemble a rectangular, square, circular, or other shape. Included with the system is a solar conversion module having a photovoltaic cell that is alignable with the area. The cell converts the focused reflected sunlight into electrical energy when aligned with the area.

11 Claims, 9 Drawing Sheets

(56) References Cited

U.S. PATENT DOCUMENTS

| | | |
|---|---|---|
| 2008/0037141 A1 | 2/2008 | Tom et al. |
| 2008/0129984 A1 | 6/2008 | Cowley |
| 2008/0142000 A1 | 6/2008 | Milbourne |
| 2008/0142076 A1 | 6/2008 | Horne et al. |
| 2008/0142077 A1 | 6/2008 | Spencer et al. |
| 2008/0185032 A1 | 8/2008 | MacDonald |
| 2008/0185039 A1 | 8/2008 | Chan |
| 2008/0185040 A1 | 8/2008 | Tom et al. |
| 2008/0186593 A1 | 8/2008 | Chan et al. |
| 2008/0203411 A1 | 8/2008 | Chan |
| 2008/0251113 A1 | 10/2008 | Horne et al. |
| 2008/0258051 A1 | 10/2008 | Heredia et al. |
| 2008/0264468 A1 | 10/2008 | Young et al. |
| 2008/0264469 A1 | 10/2008 | Milbourne et al. |
| 2008/0289271 A1 | 11/2008 | Miller et al. |
| 2008/0314437 A1 | 12/2008 | Regev |
| 2009/0025784 A1 | 1/2009 | Chan et al. |
| 2009/0025789 A1 | 1/2009 | Chan et al. |
| 2009/0026279 A1 | 1/2009 | Dittmer et al. |
| 2009/0050191 A1 | 2/2009 | Young et al. |
| 2009/0056790 A1 | 3/2009 | Tian et al. |
| 2009/0101207 A1 | 4/2009 | Milbourne et al. |
| 2009/0107540 A1 | 4/2009 | Milbourne |
| 2009/0114211 A1 | 5/2009 | Homyk et al. |
| 2009/0114213 A1 | 5/2009 | McDonald et al. |
| 2009/0114265 A1 | 5/2009 | Milbourne et al. |
| 2009/0114280 A1 | 5/2009 | Jensen et al. |
| 2009/0116013 A1 | 5/2009 | Tom et al. |
| 2009/0117332 A1 | 5/2009 | Ellsworth et al. |
| 2009/0120499 A1 | 5/2009 | Prather et al. |
| 2009/0120500 A1 | 5/2009 | Prather et al. |
| 2009/0126774 A1 | 5/2009 | Taylor, II et al. |
| 2009/0179139 A1 | 7/2009 | Hines et al. |
| 2009/0223509 A1 | 9/2009 | Hoellenriegel et al. |
| 2010/0236626 A1* | 9/2010 | Finot et al. .................. 136/259 |

FOREIGN PATENT DOCUMENTS

| | | |
|---|---|---|
| JP | 2002-081763 A | 3/2002 |
| KR | 10-2010-0066745 A | 6/2010 |
| KR | 10-0968751 B1 | 7/2010 |

OTHER PUBLICATIONS

International Preliminary Report on Patentability (PCT/US2011/056114), dated Apr. 16, 2013.

Wu, "Supernormal Vision, A Focus on Adaptive Optics Improves Images of the Eye and Boosts Vision", found at www.sciencenews.org/sn_arc97/11_15_97/bob1.htm.

This application is related to U.S. Appl. No. 12/899,316, filed Oct. 6, 2010.

This application is related to U.S. Appl. No. 12/974,963, filed Dec. 21, 2010.

Dong, Lee Hyun, PCT International Search Report for PCT/US2010/051683, Korean Intellectual Property Office, Jul. 19, 2011.

\* cited by examiner

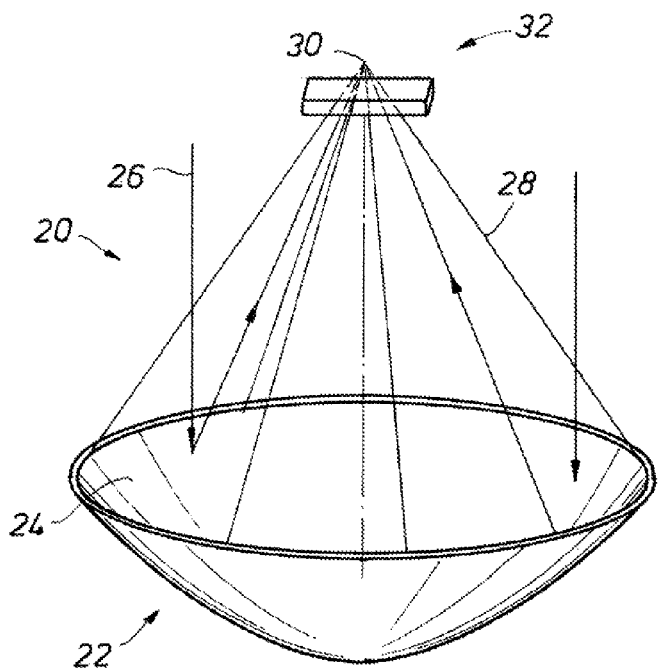
*FIG.1A*
(PRIOR ART)
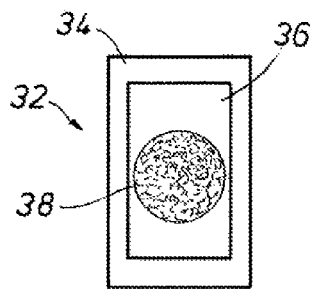
*FIG.1B*
(PRIOR ART)
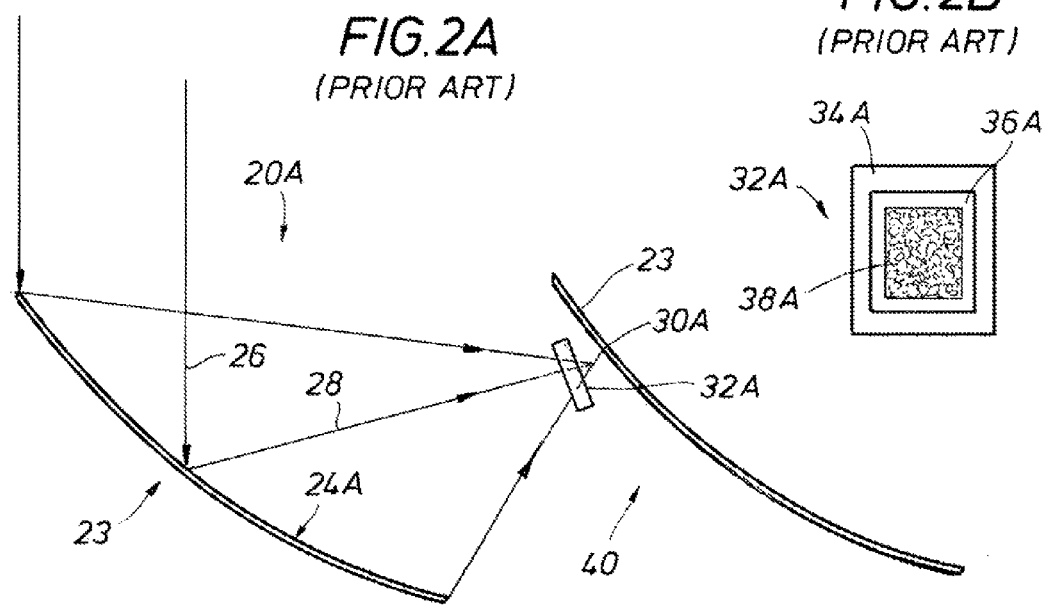
*FIG.2A*
(PRIOR ART)
*FIG.2B*
(PRIOR ART)

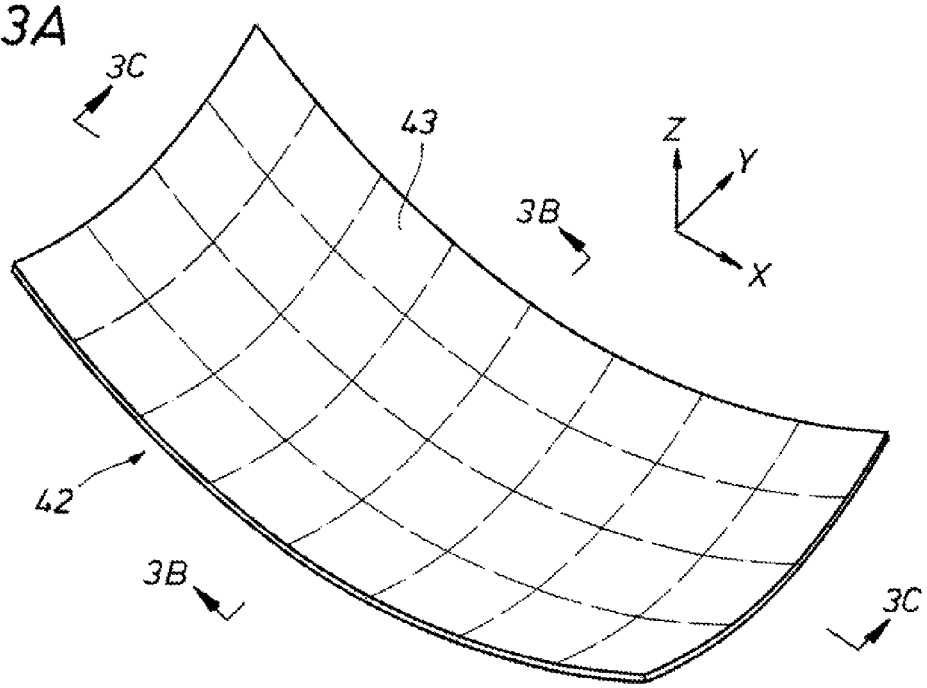
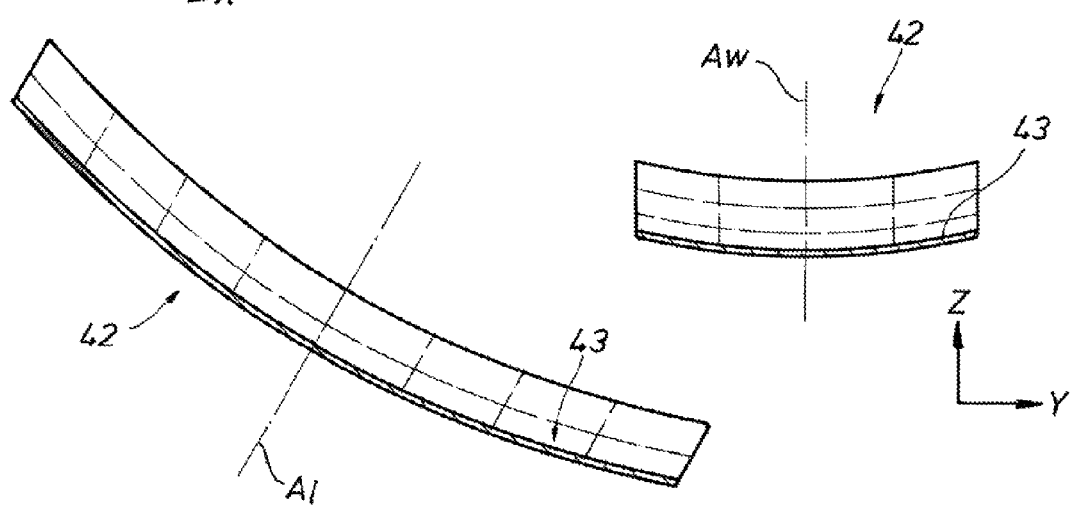

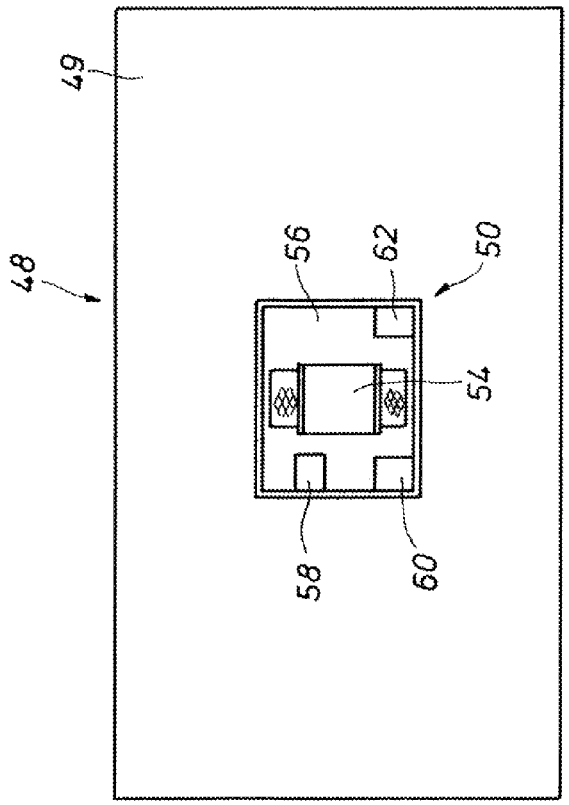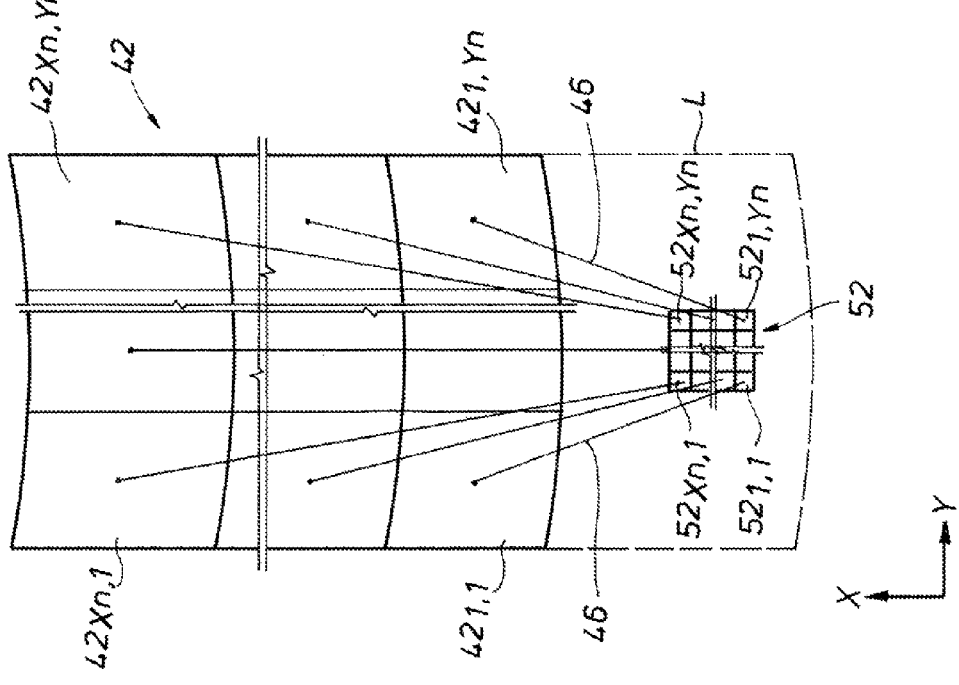

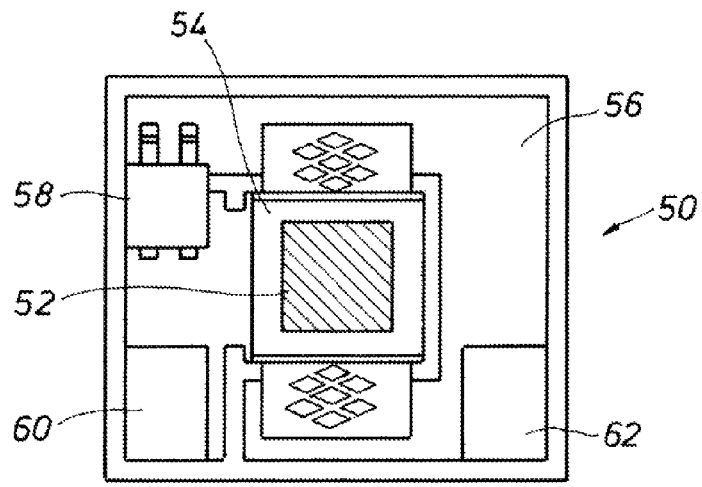
FIG. 8
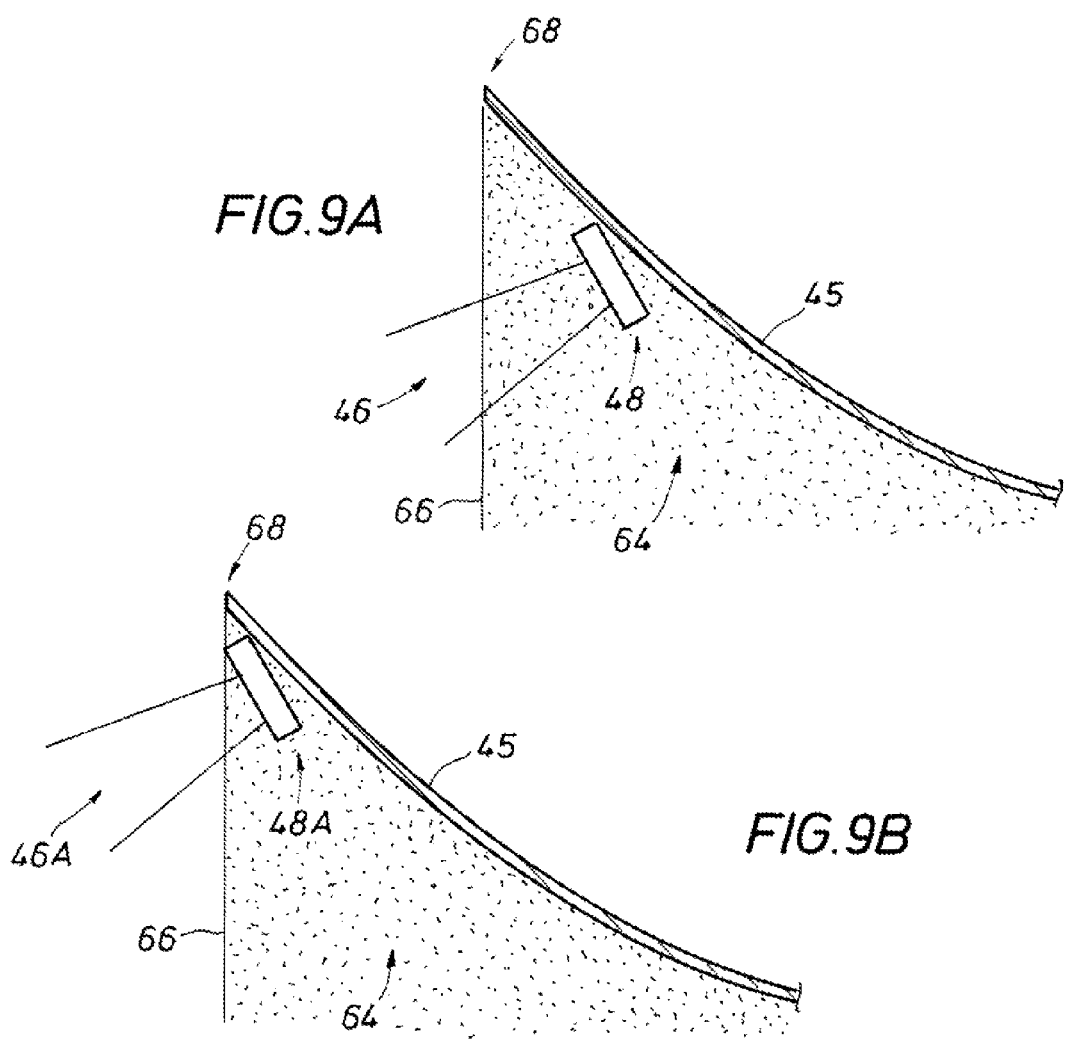
FIG. 9A
FIG. 9B

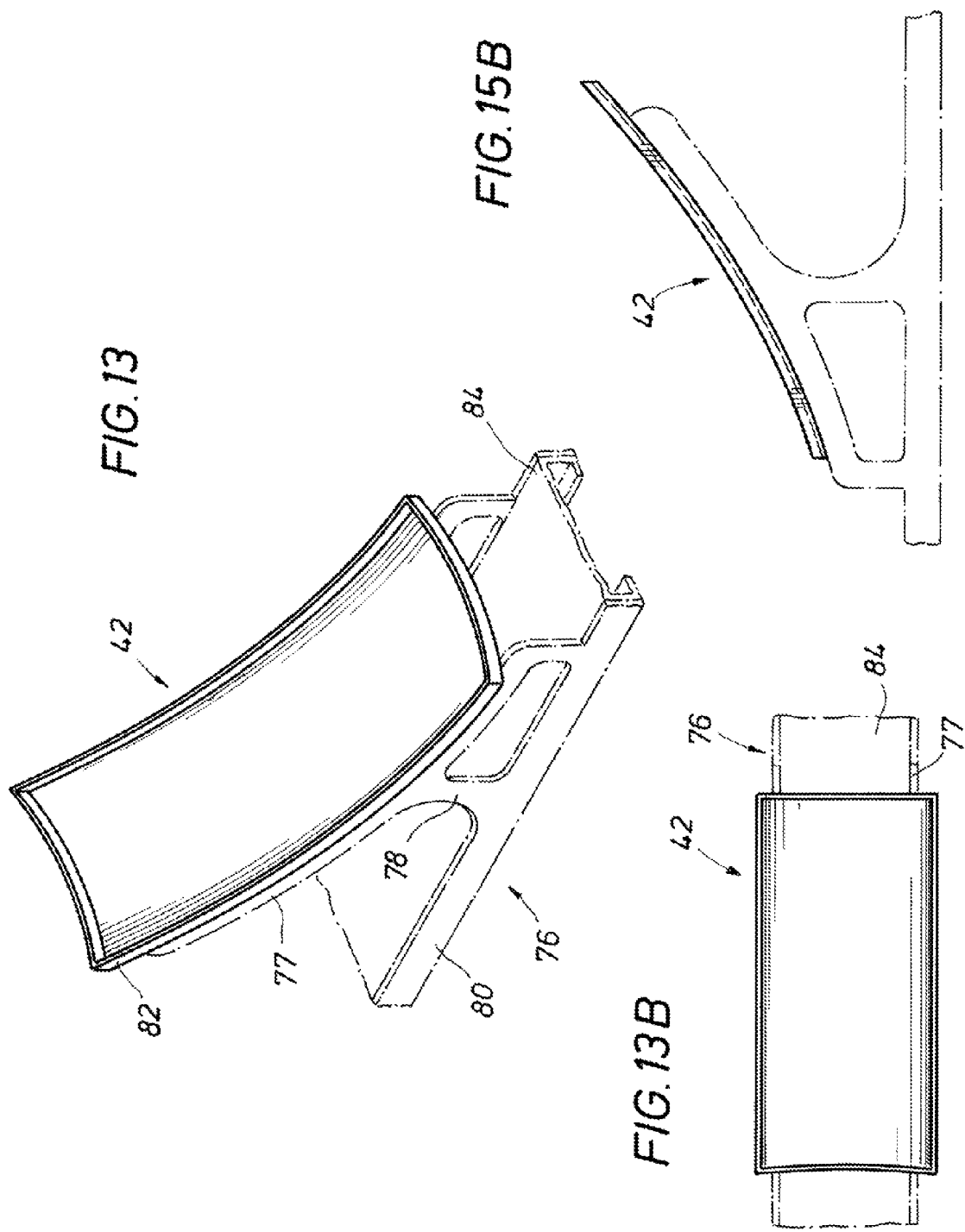

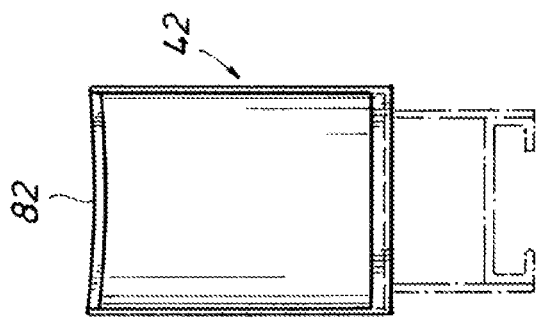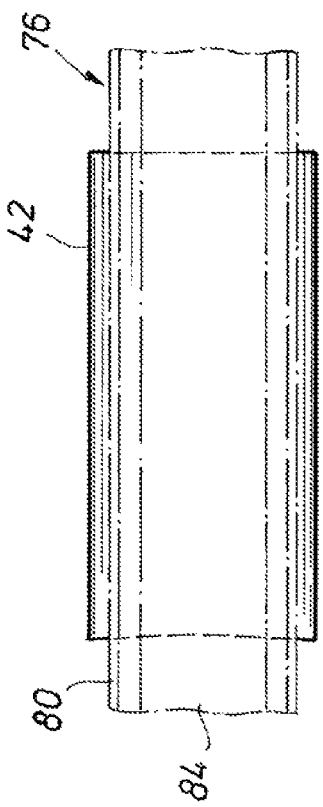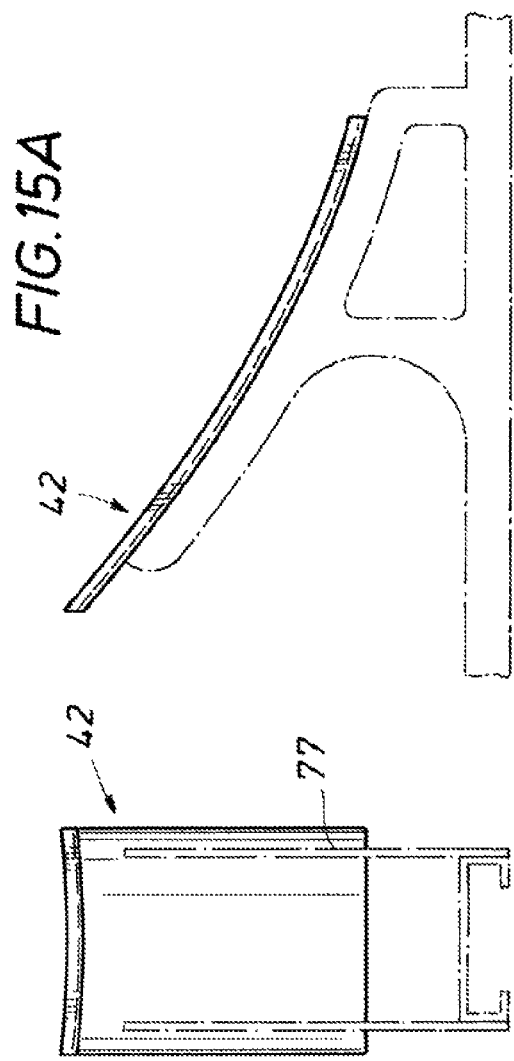

NON-PARABOLIC SOLAR CONCENTRATION TO AN AREA OF CONTROLLED FLUX DENSITY CONVERSION SYSTEM AND METHOD

RELATED APPLICATIONS

This application claims priority to and the benefit of U.S. Provisional Application Ser. No. 61/249,202, filed Oct. 6, 2009, the full disclosure of which is hereby incorporated by reference herein.

BACKGROUND OF THE INVENTION

1. Field of the Invention

The present disclosure relates in general to a solar conversion system that concentrates solar energy non-parabolically and converts the concentrated energy into electrical energy. More specifically, the present disclosure includes a solar conversion system having a non-parabolic solar collector that concentrates reflected solar energy into a focal area of controlled flux density.

2. Description of Prior Art

FIG. 1A illustrates a prior art view of a solar conversion system 20 shown in a side perspective view. The solar conversion system 20 includes a parabolic dish 22 having a reflective surface 24 on its concave side that reflects sun rays 26 to form reflected rays 28. The dish 22 concentrates the reflected rays 28 towards a focal point 30 offset a distance from the dish 22. A receiver module 32 is disposed in the path of the reflected rays 28 with its front surface positioned between the focal point 30 and the dish 22. FIG. 1B shows a side of the receiver module 32 facing the dish 22 and illustrates the receiver module 32 with a module surface receiving the reflected rays 28. The module 32 includes a mounting base 34 having a photovoltaic cell 36 is mounted thereon. The concentrated reflected rays 28 form a circular image 38 on the photovoltaic cell 36. The flux density of the image 38 on the cell 36, for example, may be a thousand times the flux density received by the dish 22. The high intensity light flux may damage or shorten the life of the photovoltaic cell 36 by direct exposure or heat buildup in the module 32. The heating of the module 32 and cell 36 is exacerbated by disposing the module 32 in the direct sunlight.

FIG. 2A illustrates one known method to reduce the thermal energy applied to the module 32A. Shown in a side view is a solar conversion system 20A having a parabolic leaf 23 with a reflective surface 24A on its concave side. Sun rays 26 reflect from the parabolic leaf 23 as reflected rays 28 that converge to a focal point 30A below the midpoint of the leaf 23. This is unlike the dish 22 whose focal point 30 is bisected by a line disposed substantially normal to the midpoint of the dish 22. Lowering the focal point 30A below the midpoint of the leaf 23 positions the corresponding receiver module 32A on the convex side of an adjacent forward leaf 23. As shown in the upward looking plan view of FIG. 2B, the concentrated reflected rays 28 from the leaf 23 create an image 38A having inconsistent flux density onto a photovoltaic cell 36A. The uneven flux limits the total energy that may be converted by the module 32A due to the low density flux portions of the image 38A. The image 38A in FIG. 2B illustrates the leaf 23 of FIG. 2A unevenly concentrating rays to create high density flux areas on the photovoltaic cell 36A that may exceed operational limits of the cell 36A and damage those areas.

SUMMARY OF THE INVENTION

Disclosed herein is a solar energy conversion system to convert solar light energy into electrical energy. In one example, the conversion system includes a first solar collector having a reflective front surface contoured so that when positioned to receive solar light energy from the sun, the solar light energy contacts the reflective surface, is reflected from the collector outwardly from the reflective surface, and is concentrated in a planar portion of a plane having substantially constant flux density throughout the planar portion to thereby define a planar focal area, a photovoltaic cell having at least a portion of a surface coincident with the planar focal area to receive the concentrated light energy thereon, and a resistive load in electrical communication with the photovoltaic cell so that the concentrated light energy received by the photovoltaic cell is thereby converted to electrical energy and communicated to the resistive load. The planar focal area can be formed so that it resembles shapes such as, but not limited to, a rectangle, a square, a circle, or an ellipse. In one example, the ratio of planar focal area to photovoltaic cell surface area can range from about 1:2 to about 2:3. The collector can be profiled so discrete amounts of solar light energy reflect from locations on the reflective surface to define paths from the reflective surface to corresponding locations on the focal area. In one example of the system the paths defined by the reflected solar energy do not intersect. Other embodiments may include paths of reflected solar energy that intersect in any manner. The system may further include a second solar collector having a front surface and a rear surface positioned to face the reflective front surface of the first solar collector, a shaded area adjacent the second solar collector rear surface, and wherein the photovoltaic cell is connected to the rear surface of the second solar collector and positioned within the shaded area to receive solar light energy when reflected from the reflective front surface of the first solar collector. A heat transfer system can optionally be included that is in thermal communication with the photovoltaic cell. A multiplicity of additional collectors can be added along with corresponding photovoltaic cells, wherein the collectors are arranged in rows to form an array of collectors.

The present disclosure includes a method of converting solar energy to electricity. In one example the method includes providing a collector comprising a reflective side profiled so that when light rays reflect from the reflective side, they converge to a focal area having a substantially uniform flux density, providing a solar conversion cell having a surface that coincides in space with the focal area, orienting the collector so that the reflective side is in the path of rays from the sun that contact and reflect from the reflective side of the collector and converge onto the surface of the solar conversion cell with substantially uniform flux density that is converted to electricity in the solar conversion cell, and directing the electricity converted by the solar conversion cell to a resistive load. The focal area of the method can be approximately shaped as desired, including but not limited to a rectangle, a square, a circle, a polygon, or an ellipse. The collector can be positioned to receive maximum light intensity from the rays contacting the collector. Alternatively, the collector can reflect sun rays to converge onto the surface of the solar conversion cell in a controlled, non-uniform flux. Optionally, the method can involve orientating the collector in a position to receive maximum light intensity from the rays contacting the collector as the sun changes its relative position to the collector. A second collector can be included in the present method, where the second collector has a reflective side, and the method includes placing the second collector in substantially the same orientation and in front of the collector, positioning the second collector so that its side opposite its reflective side is adjacent the solar conversion module, and mounting the solar conversion cell onto the second collector.

The solar conversion cell can be placed in an area shaded by the second collector. In an alternative embodiment, the method can include repeating the steps of providing the collector and conversion cell so that multiple collectors with corresponding multiple solar conversion cells are provided. The reflective surface can be profiled so that when it is positioned in the path of light from the sun, discrete amounts of solar light energy reflect from locations on the reflective surface and define paths from the reflective surface to corresponding locations on the focal area and wherein the paths do not intersect. Other embodiments may include paths of reflected solar energy that intersect in any manner. Optionally, the size of the focal area can be a percentage of the size of the solar conversion cell.

BRIEF DESCRIPTION OF THE DRAWINGS

Some of the features and benefits of the present invention having been stated, others will become apparent as the description proceeds when taken in conjunction with the accompanying drawings, in which:

FIG. 1A is a side perspective view of a prior art solar conversion system.

FIG. 1B is a plan view of an image projected onto a module by the solar conversion system of FIG. 1A.

FIG. 2A is a side view of a prior art solar conversion system.

FIG. 2B is a plan view of an image projected onto a module by the solar conversion system of FIG. 2A.

FIG. 3A is a side perspective view of an example of a solar collector in accordance with the present disclosure.

FIG. 3B is a sectional view of the solar collector of FIG. 3A taken along section lines 3B-3B.

FIG. 3C is a sectional view of the solar collector of FIG. 3A taken along section lines 3C-3C.

FIG. 6 is an overhead plan view of the collector and focused beam of FIG. 4A.

FIG. 7 is an overhead plan view of an example of a solar conversion module in accordance with the present disclosure.

FIG. 8 is an overhead plan view of a focused beam imaged on the solar conversion module of FIG. 7.

FIGS. 9A and 9B are side views of an example of a solar conversion module disposed in spaces that are shaded by a solar collector.

FIG. 13 is a perspective view of a solar collector in accordance with the present disclosure.

FIG. 13A is an overhead view of the solar collector of FIG. 13.

FIG. 13B is a bottom plan view of the solar collector of FIG. 13.

FIG. 14A is a front elevational view of a solar collector in accordance with the present disclosure.

FIG. 14B is a rear elevational view of the solar collector of FIG. 14A.

FIG. 15A is a downward plan view of a solar collector in accordance with the present disclosure.

FIG. 15B is an upward looking view of the solar collector of FIG. 15A.

Figure 4A:
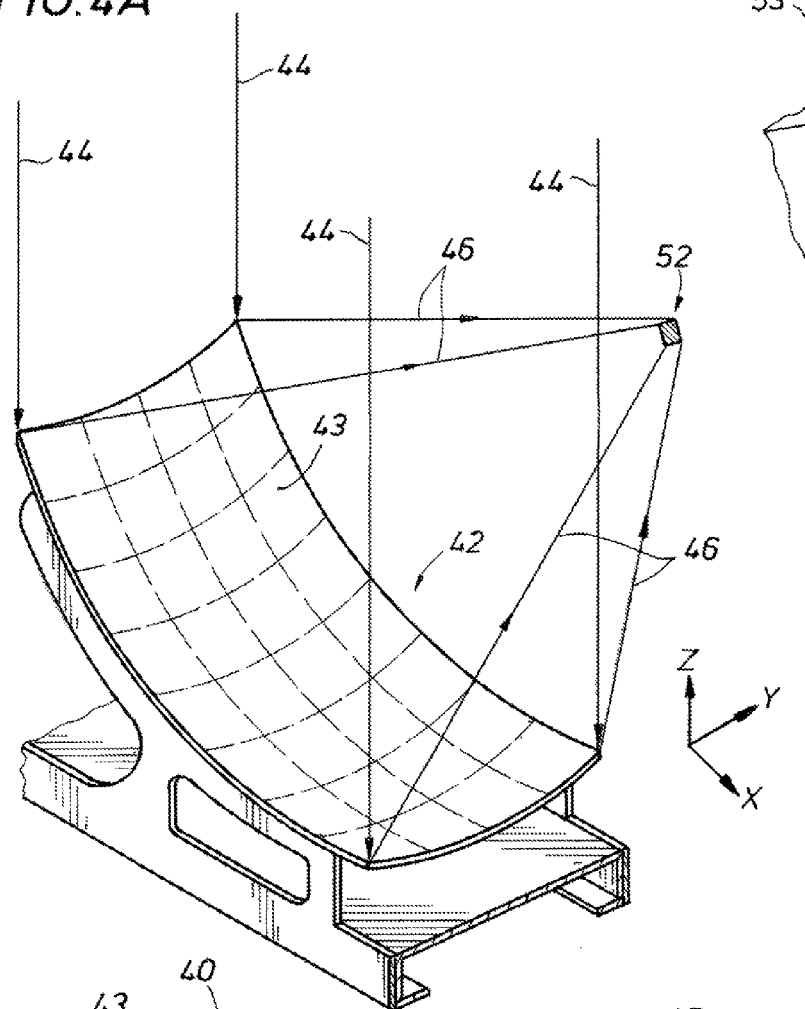
FIG. 4A is a side perspective view of an example of a focused beam having a substantially uniform flux density and formed using the collector of FIGS. 3A-3C.

It will be understood the improvement described herein is not limited to the embodiments provided. On the contrary, the present disclosure is intended to cover all alternatives, modifications, and equivalents, as may be included within the spirit and scope of the improvement as defined by the appended claims.

DETAILED DESCRIPTION OF THE INVENTION

The present invention will now be described more fully hereinafter with reference to the accompanying drawings in which embodiments of the invention are shown. This invention may, however, be embodied in many different forms and should not be construed as limited to the illustrated embodiments set forth herein; rather, these embodiments are provided so that this disclosure will be thorough and complete, and will fully convey the scope of the invention to those skilled in the art. Like numbers refer to like elements throughout. For the convenience in referring to the accompanying figures, directional terms are used for reference and illustration only. For example, the directional terms such as "upper", "lower", "above", "below", and the like are being used to illustrate a relational location.

It is to be understood that the invention is not limited to the exact details of construction, operation, exact materials, or embodiments shown and described, as modifications and equivalents will be apparent to one skilled in the art. In the drawings and specification, there have been disclosed illustrative embodiments of the invention and, although specific terms are employed, they are used in a generic and descriptive sense only and not for the purpose of limitation.

FIG. 3A illustrates a side perspective view of an example of a collector 42 in accordance with the present disclosure. A reference X-Y-Z Cartesian coordinate axis is included with FIG. 3A, wherein the Z axis represents a spatial vertical reference. The collector 42 of FIG. 3A is a thin member having an elongate length and tilted so that one of the ends in the elongate direction is elevated on the Z axis with respect to the other. The collector 42 is profiled along its length and width. The collector 42 can include aluminum 5052 and be formed by a stamping process. The concave surface can be polished to create a reflective surface having up to about an 85% reflectivity. Optionally the concave surface can be coated to make it reflective. Other materials for use in making example collectors 42 include glass, composites, and molded plastic materials. Referring now to FIG. 3B, a sectional view of the collector 42 is illustrated taken along the width of the collector 42 at section lines 3B-3B. Illustrated in FIG. 3B, the collector 42 has a curved profile between its lateral elongate sides such that its respective lateral edges are at an elevation different from its mid portion. A reference width axis $A_W$ is included in FIG. 3B oriented parallel to the Z axis, and perpendicular to the Y axis. In the example of FIG. 3B the collector 42 width is substantially symmetric about its axis $A_W$.

FIG. 3C illustrates an example of the collector 42 in a side sectional view along its length at sectional lines 3C-3C. Similar to the profile along the width of the collector 42, the profile along the length of the collector 42 is generally concave. A reference length axis $A_L$ is shown on the collector 42 at about the midpoint of its length. The axis $A_L$ is oblique to both the Z and X axes and normal to a line extending between the elongate ends of the collector 42. The length of the collector 42 of FIG. 3C is not symmetric about axis $A_L$. Moreover, the lengthwise section illustrated in FIG. 3C is not parabolic. The profiled length and width form a concave side of the collector 42 on which a reflective surface 43 is disposed. For the purposes of discussion herein, depth in the collector 42 is the distance from the surface 43 to a line (not shown) extending from opposite ends of the collector 42 and parallel to one of axes $A_L$ or $A_W$.

Figure 4B:
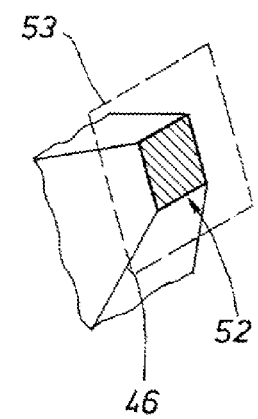
FIG. 4B is an enlarged perspective view of the focused beam of FIG. 4A.

FIG. 4A illustrates an example collector 42 having its reflective surface 43 oriented to receive solar light energy from sun, represented herein as sun rays 44 that reflect away as reflected rays 46. The collector 42 of FIG. 4A is configured so that the reflected rays 46 converge and focus on a planar area to form a rectangular image 52 with a controlled flux density. In one example, a controlled flux density means that a desired image flux density can be obtained by configuring the collector 42 to create an image 52 with a particular flux density. Particular flux densities include those having a set total value, ranges of values across the image 52, a maximum/minimum value on the image 52, as well as a distribution or variance of values of flux density on the image 52. An image 52 having a substantially constant flux density along its area is an example of a controlled flux density. The planar area in which the reflected rays 46 converge may be referred to herein as a focal area. Alternatively, both the collector 42 and the image 52 can take on any recognizable shape, such as a square, polygon, circle, ellipse, diamond, triangle, and the like, or the collector 42 and/or image 52 can be a combination of recognizable shapes as well as an unrecognizable non-uniform shape. Referring now to FIG. 4B, enlarged depiction is provided of how the reflected rays 46 focus along an area coincident with a plane 53.

Figure 5:
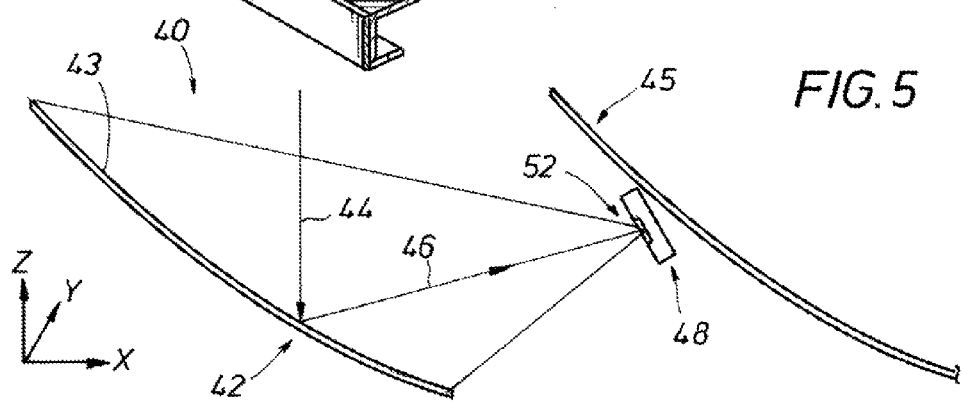
FIG. 5 is a side view an embodiment of a solar conversion system in accordance with the present disclosure.

FIG. 5 illustrates in a side elevational view an example of a solar conversion system 40 in accordance with the present disclosure. The system 40 includes a collector 42 with a reflective surface 43; sun rays 44 reflect from the reflective surface 43 to create reflected rays 46. As explained above, the collector 42 profile focuses the reflected rays 46 into a focal area to create an image 52. The system 40 of FIG. 5 further includes a receiver module 48 attached to, or in close proximity to, a forward collector 45. The module 48 is oriented so the image 52, formed by the converging reflected rays 46, is located on a surface of the module 48 facing the reflective surface 43. The forward collector 45 may be substantially the same as the collector 42, and is illustrated positioned on the concave side of the collector 42. The module 48 is mounted on, or in close proximity to, the convex side of the collector 45. The system 40 may optionally include an additional multiplicity of collectors 42, 45 (not shown) and corresponding modules 48.

In one example of forming a collector 42, desired parameters for an image are established, and then dimensions and a configuration for a collector are determined that form an image based on the established parameters. Example parameters for the image 52 include a substantially uniform flux density within the focal area, dimensions of the image 52, a maximum angle of incidence between each reflected ray 46 and the plane 53, and a flux magnitude of the image 52. The dimensions of the image 52 and its flux magnitude can be specific to an application or dictated by operational constraints, such as the type of conversion cell on which the image 52 is projected. In one example, as noted in more detail below, the dimensions of the image 52 are a percentage of the total area of a corresponding solar conversion cell. Additional constraints affecting the design of the collector 42 include: (1) the module 48 position; (2) establishing a maximum height of the collector; and (3) a reflectivity value of the reflective surface. In an embodiment, the module 48 is positioned at a fully shaded location on the back side of an adjacent collector forward of the collector 42.

The dimensions of the collector 42 can be calculated based on the established values for the total flux of the image 52, the dimensions of the image 52, and the reflectivity of the reflective surface 43. The image 52 is partitioned into discrete areas of known dimensions and all possible reflected rays are identified (within the maximum angle of incidence) that can form each discrete area. Each ray identified reflects from a corresponding discrete area (element) on collector 42, where the corresponding element represents a possible location for a portion of the reflective surface 43. Thus, in one embodiment, overall area of the collector 42 as seen by the sun can be based on a desired solar power concentration ratio from the collector 42 to the image 52 and dimensions of the image 52. The length to width aspect ratio of the collector 42 can be any one of many values and may be dependent on a particular application or designer preference. The relative location of the collector 42 to the receiver module 48 can be set by the designer based on the spatial constraints described above. Then both the surface area of the image 52 and of the collector 42 are each partitioned into discrete areas. The mid-point of each discrete area on the collector 42 is mapped to a corresponding discrete area on the image 52. In one example, mapping includes spatially identifying the path of a reflected ray 46 that intersects the corresponding mid-points on the collector 42 and the image 52. The XY coordinates of the mid-points of each discrete area on the collector 42 are known and the XYZ coordinates of the mid-points of each discrete area on the image 52 are also known. By mapping between corresponding mid-points on the collector 42 and image 52, each discrete area of the collector 42 can be set at an angle to direct reflected rays 46 along the mapped path. Thus the angle and resulting Z value of each collector element can then be computed using vector algebra.

FIG. 6 schematically depicts an example of how reflected rays 46 travel from the collector 42 on their way to forming the image 52. In this example, the collector 42 is illustrated in an overhead plan view simulating its orientation with respect to the sun. As shown, the collector 42 is angled to horizontal, thus its apparent length (distance along the X-axis) will be less than its actual length. In FIG. 6, the apparent length is illustrated using solid lines; the difference between apparent length and actual length L is represented by a dashed line. The collector 42 is partitioned into elements represented in matrix form as $42_{1,1}$-$42_{Xn, Yn}$. Although illustrated as having substantially the same length in the X direction, these elements $42_{1,1}$-$42_{Xn, Yn}$ may have different actual lengths due to how the collector 42 is angled with respect to horizontal. The beam is also partitioned, shown having elements $52_{1,1}$-$52_{Xn, Yn}$. Reflected rays 46 are further illustrated to represent reflected solar energy from each element of the collector 42 to the corresponding element of the image 52. For example, reflective beam 46 from collector element $42_{1,1}$ passes to element $52_{1,1}$ and forms that portion of the image 52. Similarly, reflective beam 46 from element $42_{Xn, 1}$ passes to element $52_{Xn, 1}$, reflective beam 46 from element $42_{1, Yn}$ passes to element $52_{1, Yn}$, and so on. Although collector elements $42_{1,1}$-$42_{Xn, Yn}$ may vary in actual area, the flux produced by each element $42_{1,1}$-$42_{Xn, Yn}$ can be substantially the same.

Since each element $42_{1,1}$-$42_{Xn, Yn}$ can create the same amount of flux, the flux density across the image 52 can be made substantially uniform.

FIG. 7 illustrates an overhead plan view of an example embodiment of a receiver module 48. As shown, the receiver module includes a base 49 illustrated as a largely rectangular member having a receiver assembly 50 mounted onto the base 49. The receiver assembly 50 includes a rectangular shaped conversion cell 54 disposed roughly in the mid section of the receiver assembly 50 and on a module substrate 56. In one example, the conversion cell 54 is a photovoltaic cell for converting light energy into electrical energy. A diode 58 is shown included with the receiver assembly 50 that is electrically connected with the conversion cell 54 and leads 60, 62 on which wires (not shown) or other electrically conducting members can be attached for delivering current from the conversion cell 54 for use or storage.

The receiver assembly 50 is illustrated in an overhead plan view in FIG. 8 with an example of the image 52 positioned on the conversion cell 54. For the purposes of discussion herein, in an example, the image 52 is positioned on the cell 54 when the plane 53 (FIG. 4B) in which it is focused coincides with the upper surface of the conversion cell 54. Optionally, the plane 53 where the image 52 is focused could be just above or just below the upper surface of the conversion cell 54. In this example, the image 52 is largely rectangular with an area less than the area of the conversion cell 54. In one example of use, the collector 42 (FIG. 6) is profiled to form the image 52 at a set percentage of the conversion cell 54 where example percentages include 50%, 55%, 60%, 64%, 65%, 70%, 75%, and 95%. An advantage of an image 52 having an area less than the area of the conversion cell 54 is the image 52 can be misaligned (e.g. not centered on the cell 54) and yet still project its full area onto the conversion cell 54. Additionally, in an embodiment, the system described herein reflects sunlight directly to a conversion cell without the reflected light encountering a cover, lens or a secondary reflector. A secondary reflector can reduce efficiency by up to 10% from the design disclosed herein.

FIG. 9A illustrates in a side view a module 48 on the convex side of a forward collector 45. In this example, the module 48 receives reflected rays 46 while in a shaded area 64 shielded by the forward collector 45 from direct sunlight. The shaded area 64 is bounded on one side by the collector 45 and on its other side by line 66 shown extending substantially vertical and depending downward from the collector 45 upper edge 68. Optionally, as shown in FIG. 9B, the receiver 48A could be disposed at multiple positions along the convex side of the collector 45 within the shaded area 64. The position of the module 48A will dictate direction and orientation of the reflected rays 46A contacting the module 48A.

Figure 10:
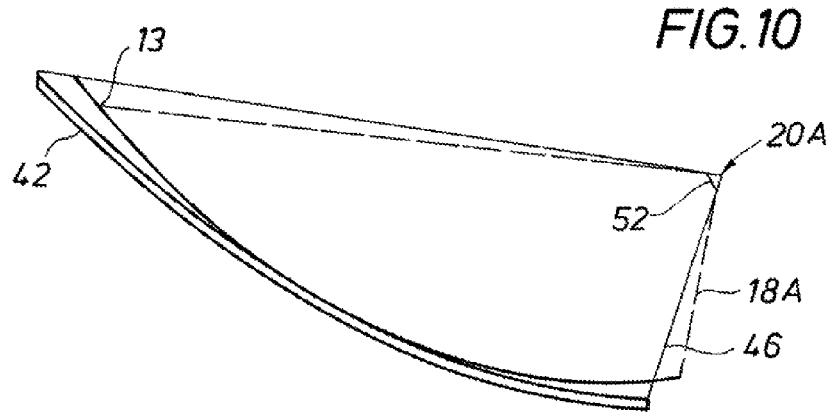
FIG. 10 is a side view of an example of a collector and a corresponding focal beam in accordance with the present disclosure alongside a parabolic collector and its focal point.
Figure 11A:
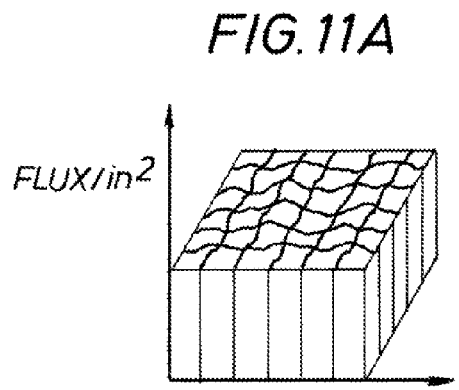
FIGS. 11A and 11B are perspective views of flux densities for the focal beam and focal point of FIG. 10.
Figure 11B:
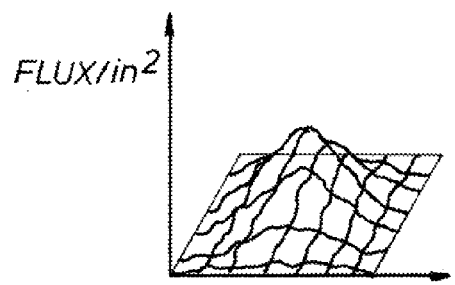

FIG. 10 illustrates in a side view a parabolic-type collector 13 positioned adjacent a collector 42 formed in accordance with the present disclosure. Also shown is an example of how the reflected rays 18A converge at the focal point 20A of the parabolic reflector 13; and how the reflected rays 46 converge to form the constant flux density image 52. FIGS. 11A and 11B provides an illustration of how the flux density of reflected light differs between the parabolic type collector 13 and collector 42 as disclosed herein. A plot representing the flux density of the image 52 of FIG. 10 is provided in a perspective view in FIG. 11A. The units of flux density are flux/unit area, thus representing flux over the surface area of the image 52. The flux density of the image 52 as shown remains substantially the same along its entire area. As discussed above, concentrated solar collectors employing parabolic reflectors typically have their conversion cell between the collector and focal point. FIG. 11B illustrates a plot representing example flux density values of an image formed by reflected rays 18A from the parabolic-shaped collector 13 and projected onto a solar cell. The flux density values illustrated in FIG. 11B are not substantially the same across its area, but instead slope upward from the periphery having a maximum towards the mid-portion of the image. This can create high energy areas on the conversion cell that may damage the cell and may require reducing the overall concentration ratio of a collector so that the maximum flux on any part of a cell does not exceed cell capacity. Thus a collector and cell arrangement having an uneven flux delivers less total flux than one with a more consistent flux density.

Figure 12:
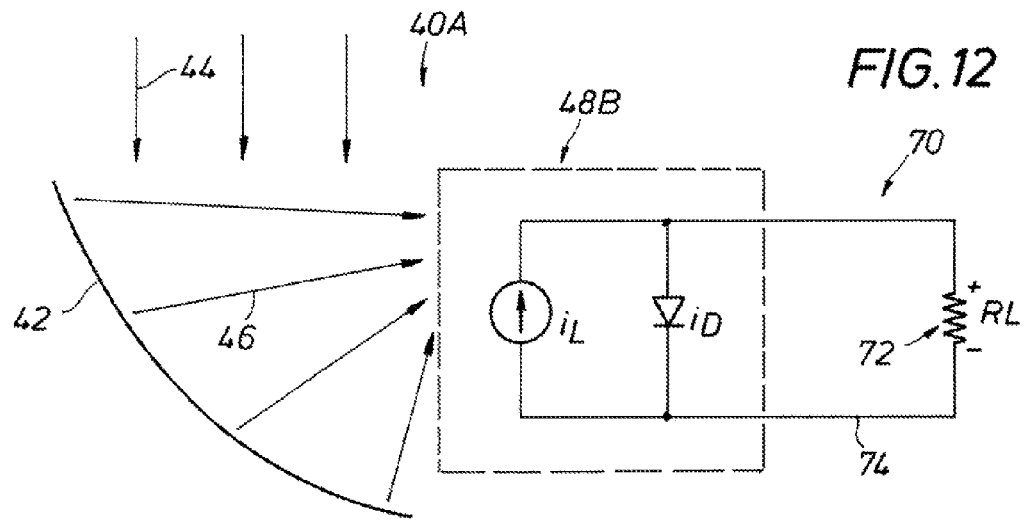
FIG. 12 is a schematic example of a solar conversion system in accordance with the present disclosure.

An example of a solar conversion system 40A is shown schematically in FIG. 12 having a non-parabolic collector 42, a receiver 48B, and a resistive load 72 in electrical communication with the receiver 48B. The receiver module 48B is schematically represented as part of a circuit 70 having a current source with current $i_L$ in parallel with a diode having current $i_D$. The circuit 70 is coupled to the receiver module 48B by conductive members 74 to the resistive load 72. Resistive load 72 may be any device that operates on or otherwise runs on or draws an electrical current or voltage, as well as any device or system for the storage of electrical current power or voltage. In an example of operation, sun rays 44 reaching the collector 42 reflect from the collector 42 to form reflected rays 46. As discussed above, the configuration of the collector 42 focuses the reflected rays 46 within a plane 53 (FIG. 4B) that strikes the conversion cell 54 (FIG. 8). The conversion cell 54 converts the solar energy of the focused rays 46 to electricity that is communicated to the resistive load 72 through the conductive members 74.

FIG. 13 is a side perspective views of an example of a collector 42 mounted on a frame 76. Aluminum 5052 is an example material suitable for the frame 76. FIGS. 13A and 13B provide upper and lower plan views of the collector 42 and frame 76 of FIG. 13. The collector 42 rests on elongate cradles 77 shown substantially parallel to axis $A_W$ each proximate to opposing sides of the collector 42. The cradles 77 have a side contoured to receive the convex side of collector 42. The cradles 77 are supported and oriented by vertically oriented legs 78 that attach to a side of the cradles 77 opposite the side receiving the collector 42. The legs 78 are shown attached at an end and at about a mid portion of each cradle 77. The position of the legs 78 and their relative heights determine the angle at which the cradle 77 is oriented with respect to horizontal, and thus the orientation of the collector 42. The ends of the legs 78 opposite the cradle 77 are attached to elongated girders 80 that are shown parallel to the cradles 77. A channel member 84 having a C-shaped length-wise cross section is provided in the space between the parallel girders 80. The channel member 84 is oriented so the open portion of the "C" is facing downward away from the collector 42. An optional lip 82 is shown formed on the elongate sides of the collector 42 at its outer periphery. The lip 82 as shown is parallel to a line spanning between the X and Z axes. The lip 82 can retain the collector 42 in its profiled shape.

FIG. 14A illustrates a front elevation view of the collector 42 of FIG. 13 taken along the X axis. The front portion of the collector 42 sits lower than its rear so that the collector 42 slopes upward from the front to rear portion. The lip 82 is shown projecting upward from the lateral sides of the collector 42 from the front to rear portion. FIG. 14B is a rear view of the collector 42 of FIG. 13 illustrating the contoured cradles 77 supporting and orienting the collector 42. Although shown disposed proximate to the lateral edges of the collector 42, the cradles 77 could be disposed closer together and inward from the edges, or replaced by a single wider cradle (not shown). Lateral side views of the collector 42 are illustrated in FIGS. 15A and 15B. The collector 42 as shown is oriented to focus an image of reflected sun rays onto a forward disposed receiver (not shown). As discussed above, along its length the collector 42 is non-parabolic and asymmetric.

Figure 16:
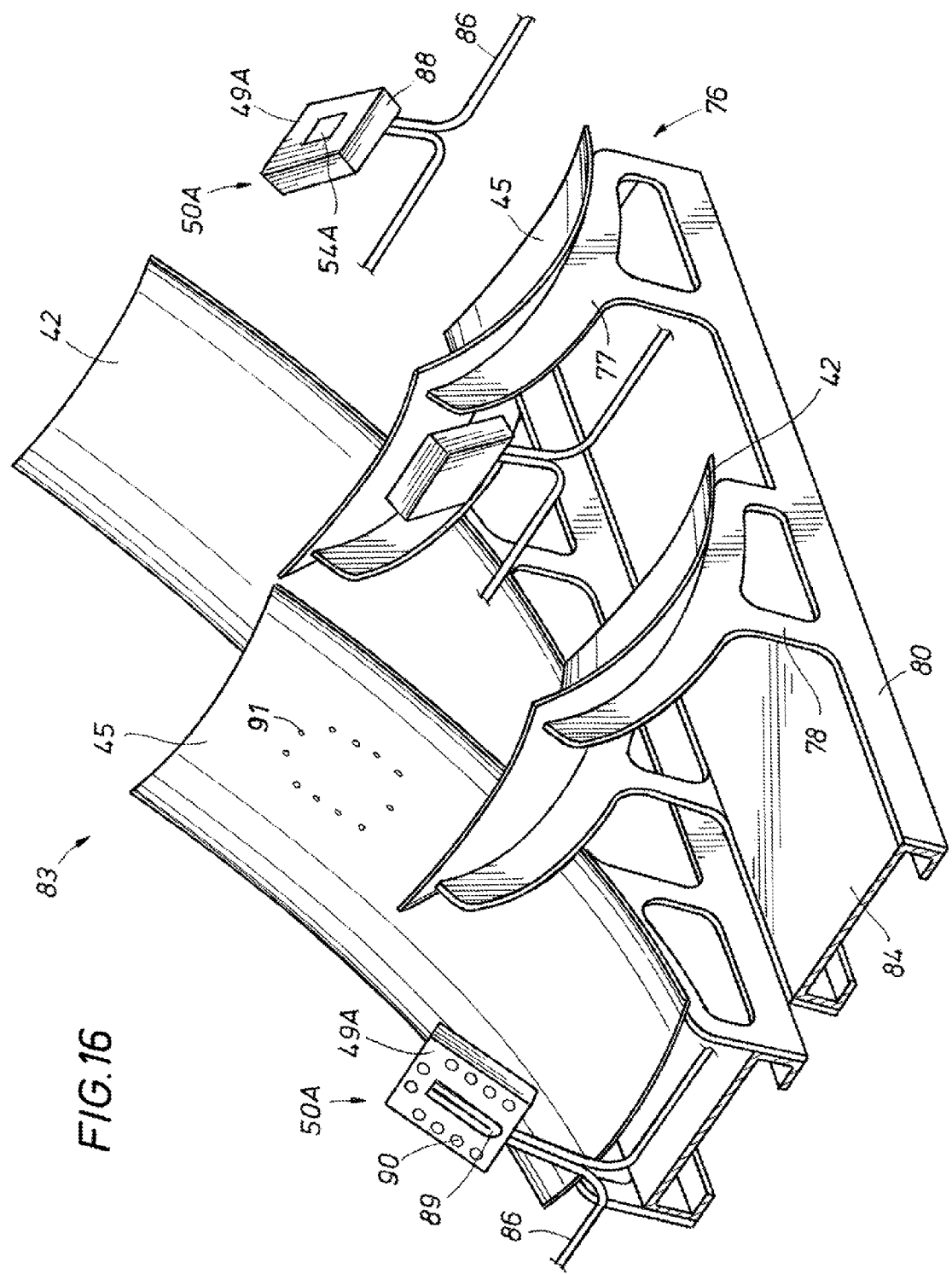
FIG. 16 is a perspective view of an example of a solar collector array set in frames, in accordance with the present disclosure.

A portion of an example of a collector array 83 is depicted in a side perspective view in FIG. 16. The array 83 illustrated includes four collectors 42, 45, two of which are adjacently located in a row with their concave sides facing in the same direction. The other two collectors 42, 45 are in an adjacent row with their respective concave sides facing in a direction opposite that of the first row. Alternative embodiments of an array 83 exist having any number of collectors. The frame 76 that supports the collectors 42, 45 straddles the C-channel member 84. The frame 76 of adjacent rows may be connected to one another or their C-channel members 84 mounted onto a platform (not shown) so that the entire array 83 can be simultaneously and continuously oriented into maximum sunlight exposure.

An alternate example of a receiver assembly 50A is shown having a conversion cell 54A set onto a surface of a planar base 49A. In one example, the base 49A draws thermal energy from the conversion cell 54A thereby acting as a heat sink. A housing 88 perpendicularly projects from the base 49A periphery and covers the side of the base 49A where the cell 54A is located. An aperture is formed through the housing 88 providing an unobstructed path for the reflected rays to impinge upon the conversion cell 54A. Tubular heat pipes 86 are shown routed through a lower lateral side of the housing 88 and into channels 89 formed lengthwise in the base 49A. The heat pipes 86 can be made from aluminum and have about a 0.3 inch diameter. After exiting the base 49A, the heat pipes 86 project in opposite directions at about a 90° angle. Fins (not shown) may be provided on the heat pipes 86 for increasing heat dissipation to ambient. The pipes 86 can contain a thermal fluid that vaporizes from heat drawn from the cell 54A, then the vaporized fluid descends to the lower end of the assembly. Heat is transferred from the vaporized fluid to ambient through the wall of the pipes 86 and fins to condense the fluid. The center of the heat pipe 86 can include a wicking medium for drawing the condensed fluid upward and adjacent the cell 54A for another cycle of cooling. A heat pipe 86 suitable for use as described herein can be obtained from Thermacore Inc., 780 Eden Rd., Lancaster, Pa. 17601, Ph (717)569-6551 or Aavid Thermalloy, 70 Commercial St., Concord, N.H. 03301 USA, Tel: (603) 224-9988, Fax: (603) 223-1790. The receiver assembly 50A is attachable to the collectors 42, 45 via corresponding bolt holes 90, 91 respectively formed in the base 49A and the collectors 42, 45. Optionally, the receiver 48 may be attached without bolts, such as with an adhesive or welding or can be suspended from the rear side of a collector 42 using a continuation of the cradle 77. Moreover, maximizing the contact area between the base 49A and the collector 42, 45 increases heat transfer between the base 49A and the collector 42, 45 thus increasing heat transfer from the conversion cell 54A. In an alternative embodiment, waste heat from the pipes 86 and/or fins can be captured for use in water heating. This would derive economic benefit from a much higher proportion of the collected solar energy.

EXAMPLE

In one non-limiting example of the device disclosed herein, the collector 42 concentrates 650 suns on a solar cell having a 1 $cm^2$ area. The collector 42 is a rectangular shaped stamped aluminum piece (approximately 14" by 8") constituting a non-parabolic solid. The solid is coated with a reflective coating with reflectivity of approximately 95%. This piece is designed to create a square beam which converges on a focal plane 1 $cm^2$ some inches to the side of the collector 42. The design of the collector 42 creates an even energy flux across the entire span of the focal plane without the interposition of any corrective optics (e.g., a homogenizer or diffuser). An optical lens may be placed in front of the focal plane to protect the cell from weather. A typical mounting configuration would place eight rectangles, one above the other, with another eight high array set by its side at 180° orientation. A multijunction cell mounts on a bracket at the focal plane of the collector 42. The focal plane is shaded by the forward positioned collector 45. The collector 42 at the front of a row is equipped with a bracket for holding the cell. The collector 42 and associated cell 54 can generate approximately 180-200 W. Each collector 42 and cell 54 is installed at an angle such that a tracking system keeps all reflective surfaces in full sunlight at all times, while all the cells and heat sinks will be in full shade. Each cell 54 can generate about 22.5 watts of direct electrical current at an efficiency of about 35%. Each cell 54 is attached to a heat sink which collects and distributes the waste heat from that cell (approximately 40 watts).

In an alternative embodiment, each cell has electrical connections which carry the produced electricity first to collection points, and then to an inverter (not shown), which converts the direct current to alternating current. The inverter, which can be an off the shelf item, can be connected to an associated electrical grid and returned to a power provider for compensation. Energy storage, such as batteries, can be inserted between the cell 54 and a centralized inverter system, this system can become a stand-alone alternative to the conventional electrical grid for those without access to a grid or prefer to be independent of a grid. The battery size is determined by the size of the system, the climate of the installation and the duration of storage capacity desired.

Concentrating the solar energy reduces the material needed in the solar cell 54 per 2.88 kW from about 2000 $in^2$ (typically used in conventional photovoltaic cells) to about 20 $in^2$. The reduced size can significantly reduce cost of the present system since solar cells are usually the most expensive component in a solar energy system. Moreover, concentrated photovoltaic cells (CPV) use less silicon than traditional photovoltaics (PV), which enhances power output since the power output of silicon decreases by about 1% per 4° F. A less silicon-intensive system, i.e. CPV, will perform far better than a PV system at high ambient temperatures, such as hot summer afternoons when solar production should be greatest. Unlike solar thermal systems, the system described herein does not require water to cool.

The present invention described herein, therefore, is well adapted to carry out the objects and attain the ends and advantages mentioned, as well as others inherent therein. While a presently preferred embodiment of the invention has been given for purposes of disclosure, numerous changes exist in the details of procedures for accomplishing the desired results. These and other similar modifications will readily suggest themselves to those skilled in the art, and are intended to be encompassed within the spirit of the present invention disclosed herein and the scope of the appended claims. While the invention has been shown in only one of its forms, it should be apparent to those skilled in the art that it is not so limited but is susceptible to various changes without departing from the scope of the invention.

The invention claimed is:

1. A method of converting solar energy to electricity comprising:
   a. providing a collector that is curved lengthwise and curved widthwise and that comprises a reflective side profiled so that when light rays reflect from the reflective side, the light rays converge to a focal area having a substantially uniform flux density;
   b. providing a solar conversion cell having a surface that coincides in space with the focal area;
   c. orienting the collector so that the reflective side is in the path of rays from the sun that contact and reflect from the reflective side of the collector and converge onto the surface of the solar conversion cell with substantially uniform flux density that is converted to electricity in the solar conversion cell; and
   d. directing the electricity converted by the solar conversion cell to a resistive load.

2. A method as defined in claim 1, wherein the focal area has a shape selected from the list consisting of a rectangle, a square, a circle, and an ellipse.

3. A method as defined in claim 1, wherein step (c) comprises orientating the collector in a position to receive maximum light intensity from the rays contacting the collector.

4. A method as defined in claim 3, further comprising continuously orientating the collector in a position to receive maximum light intensity from the rays contacting the collector as the sun changes its relative position to the collector.

5. A method as defined in claim 1, wherein the collector comprises a first collector, the method further comprising providing a second collector having a reflective side, placing the second collector in substantially the same orientation in front of the collector of step (a), positioning the second collector so that its side opposite its reflective side is adjacent the solar conversion module, and mounting the solar conversion cell onto the second collector.

6. A method as defined in claim 5, wherein the solar conversion cell is placed in an area shaded by the second collector.

7. A method as defined in claim 1, further comprising forming a solar array by repeating steps (a) and (b) to provide a multiplicity of the collectors with a multiplicity of corresponding solar conversion cells.

8. A method as defined in claim 1, wherein the reflective surface is profiled so that when it is positioned in the path of light from the sun, discrete amounts of solar light energy reflect from locations on the reflective surface define paths from the reflective surface to corresponding locations on the focal area and wherein the paths do not intersect.

9. A method as defined in claim 1, wherein the size of the focal area is a percentage of the size of the solar conversion cell.

10. A method as defined in claim 1, wherein the reflective surface is non-parabolic and wherein the collector has an elongate side and is asymmetric along its elongate side.

11. A method as defined in claim 1, wherein the solar conversion cell is a single conversion cell which receives the rays that reflect from the collector.

* * * * *